(12) United States Patent
Jeong

(10) Patent No.: US 7,863,144 B2
(45) Date of Patent: Jan. 4, 2011

(54) SEMICONDUCTOR DEVICE AND METHOD FOR MANUFACTURING THE DEVICE

(75) Inventor: Hyeong-Gyun Jeong, Incheon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 584 days.

(21) Appl. No.: 11/847,045

(22) Filed: Aug. 29, 2007

(65) Prior Publication Data

US 2008/0054411 A1    Mar. 6, 2008

(30) Foreign Application Priority Data

Aug. 31, 2006  (KR)  ............... 10-2006-0083429

(51) Int. Cl.
*H01L 21/336* (2006.01)

(52) U.S. Cl. ............ 438/295; 438/450; 438/424; 438/524

(58) Field of Classification Search ......... 438/424–454, 438/524–527, 298, 217–225, 114–450
See application file for complete search history.

(56) References Cited

U.S. PATENT DOCUMENTS 5,994,190 A * 11/1999 Hashimoto .............. 438/298

2001/0011759 A1 * 8/2001 Rho et al. .............. 257/510
2004/0185595 A1 * 9/2004 Lee .............. 438/57
2005/0176167 A1 * 8/2005 Lee .............. 438/60

* cited by examiner

*Primary Examiner*—Dung A. Le
(74) *Attorney, Agent, or Firm*—Sherr & Vaughn, PLLC

(57) ABSTRACT

Embodiments relate to a semiconductor device and a method for manufacturing the device, which suppresses off-current by improving the problem of leakage current due to hump characteristics, making it possible to maximize the reliability of the device. Embodiments relate to a method for manufacturing a semiconductor device including forming a well having two ends in a semiconductor substrate. A shallow trench isolation (STI) is formed by etching both ends of the well and the semiconductor substrate adjacent both ends of the well. A gate oxide film and a photoresist film are formed over the upper surface of the semiconductor substrate including the STI. The photoresist film is patterned for an impurity ion implant into one side area including the edge of the side wall of the STI. A barrier area is formed by implanting an impurity ion into one side area including the side wall edge of the STI using the patterned photoresist film as a mask.

9 Claims, 4 Drawing Sheets

-Related Art-

-Related Art-

-Related Art-

SEMICONDUCTOR DEVICE AND METHOD FOR MANUFACTURING THE DEVICE

The present application claims priority under 35 U.S.C. 119 to Korean Patent Application No. 10-2006-0083429, filed on Aug. 31, 2006, which is hereby incorporated by reference in its entirety.

BACKGROUND

In an LCD drive IC (LDI), an off current in a chip is a matter of primary concern in driving the device in a mobile product such as a notebook, a cellular phone, etc., as opposed to a product for a desktop. A method for manufacturing a semiconductor device according to the related art will be described with reference to FIGS. 1 and 2. As shown in FIG. 1, a P type well or N type well 102 for forming a high voltage transistor is formed with a type opposite to the semiconductor substrate type 101. A plurality of trenches are formed by etching to a predetermined depth the edges of the well 102 and the semiconductor substrate 101 adjacent the well 102. After forming the well 102, a deep well may be formed by performing a deep well drive through a thermal diffusion process at a temperature of 1150° C. for 350 minutes. Next, a liner oxidation process is performed over the inner wall of the trench twice through a high-temperature thermal oxidation process.

After the high-temperature liner oxidation process, a gap-fill oxide film may be deposited over the semiconductor substrate 101 to bury the trench. A chemical mechanical polishing (CMP) process is performed to planarize the oxide film filling the trench, forming shallow trench isolation (STI) 103. Subsequently, a gate oxide film 104 and a photoresist film 105 may be formed over the semiconductor substrate 101 including the STI 103.

Next, a hard mask may be formed over the photoresist 105. The hard mask may be used for forming a low voltage well for a plurality of devices other than the transistor device shown in FIG. 1. Accordingly, as shown in FIG. 1, photoresist film 105 may be used as a mask covering the active area and the device isolating area. That is, although not shown, the mask associated with the well and the mask associated with the active area may overlap each other by 0.132 μm so that impurity ions are not implanted.

However, as shown in FIG. 2, in a semiconductor device formed according to the foregoing method, the impurity ions implanted into the high voltage well may diffuse from the boundary of the STI into the STI area. The diffusion effects may be increased by several lengthy high temperature processes during device fabrication.

The hump characteristics in the semiconductor device caused by this diffusion phenomenon are shown in a graph in FIG. 3. The current driving ability of the device may be degraded due to increased leakage current generated from the hump characteristics, which may also degrade device reliability.

SUMMARY

Embodiments relate to a semiconductor device and a method for manufacturing a device with improved electrical characteristics, minimizing leakage currents and off currents to improve hump characteristics. Embodiments relate to a semiconductor device and a method for manufacturing the device, which suppresses off-current by improving the problem of leakage current due to hump characteristics, making it possible to maximize the reliability of the device.

Embodiments relate to a method for manufacturing a semiconductor device including forming a well in a semiconductor substrate having two ends. A shallow trench isolation (STI) is formed by etching both ends of the well and the semiconductor substrate adjacent both ends of the well. A gate oxide film and a photoresist film are formed over the upper surface of the semiconductor substrate including the STI. The photoresist film is patterned for an impurity ion implant into one side area including the edge of the side wall of the STI. A barrier area is formed by implanting an impurity ion into one side area including the side wall edge of the STI using the patterned photoresist film as a mask.

According to embodiments, impurity ions may be implanted into one side area of the STI and an active area spaced by approximately 0.244 μm from a side wall edge of the one side area of the STI so that the active area may be a barrier area.

According to embodiments, the impurity ions implanted into the barrier area may have a higher concentration than the concentration of the impurity ions in the well.

According to embodiments, the impurity ions may be N type impurity ions or P type impurity ions.

Embodiments relate to a semiconductor device which includes a well formed in a semiconductor substrate. An STI may be formed on both ends of the well and the semiconductor substrate adjacent the both ends of the well. A barrier may be formed by implanting impurity ions into the edge of the side wall of the STI.

The impurity ions may be implanted into one side area of the STI and an active area spaced by approximately 0.244 μm from a side wall edge of the one side area of the STI so that the barrier area may be formed into the active area.

DESCRIPTION

Figure 1:
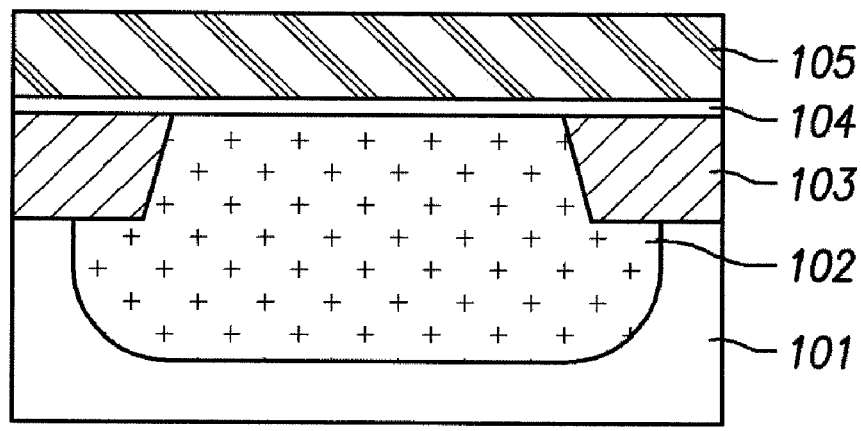
FIG. 1 is a cross-sectional view of a method of manufacturing a semiconductor device according to the related art.
Figure 2:
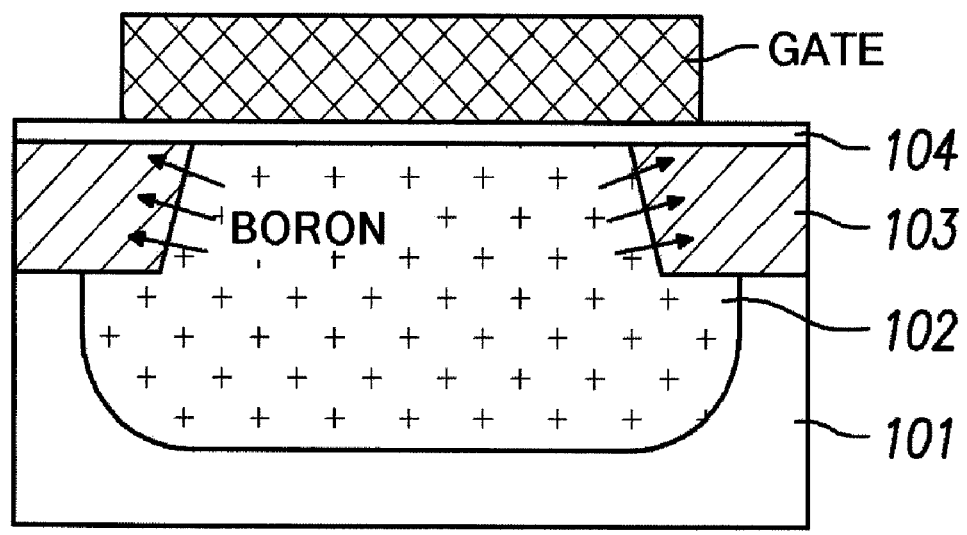
FIG. 2 is a cross-sectional view showing ion diffusion in a semiconductor device manufactured according to the related art.
Figure 3:
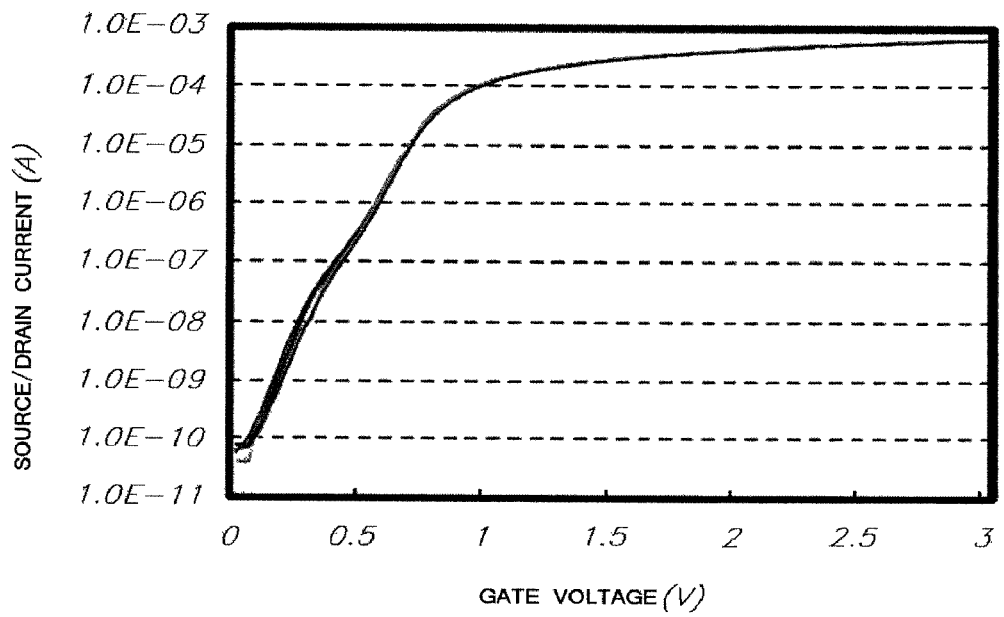
FIG. 3 is a graph representing a correlation of gate voltage and source/drain current.
Figure 4:
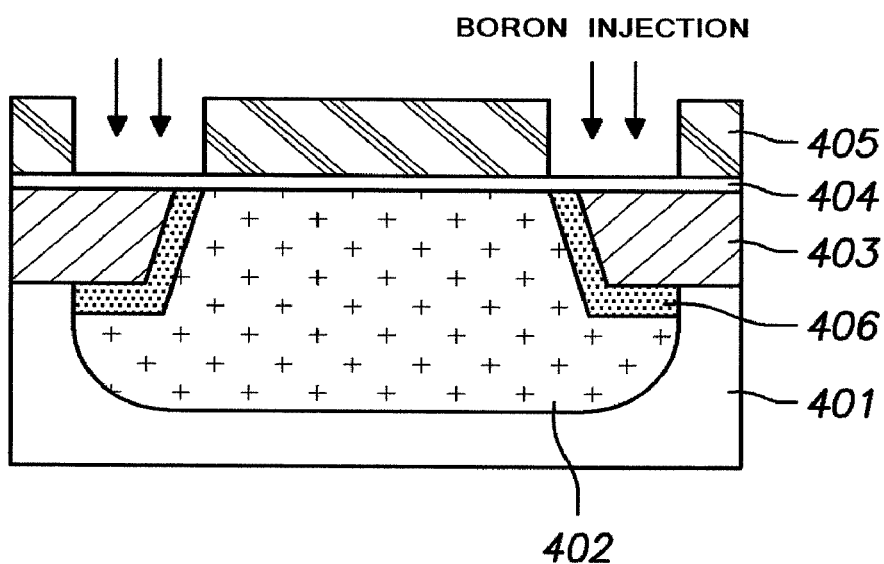

Example FIG. 4 is a cross-sectional view of a semiconductor device according to embodiments.

Figure 5A:
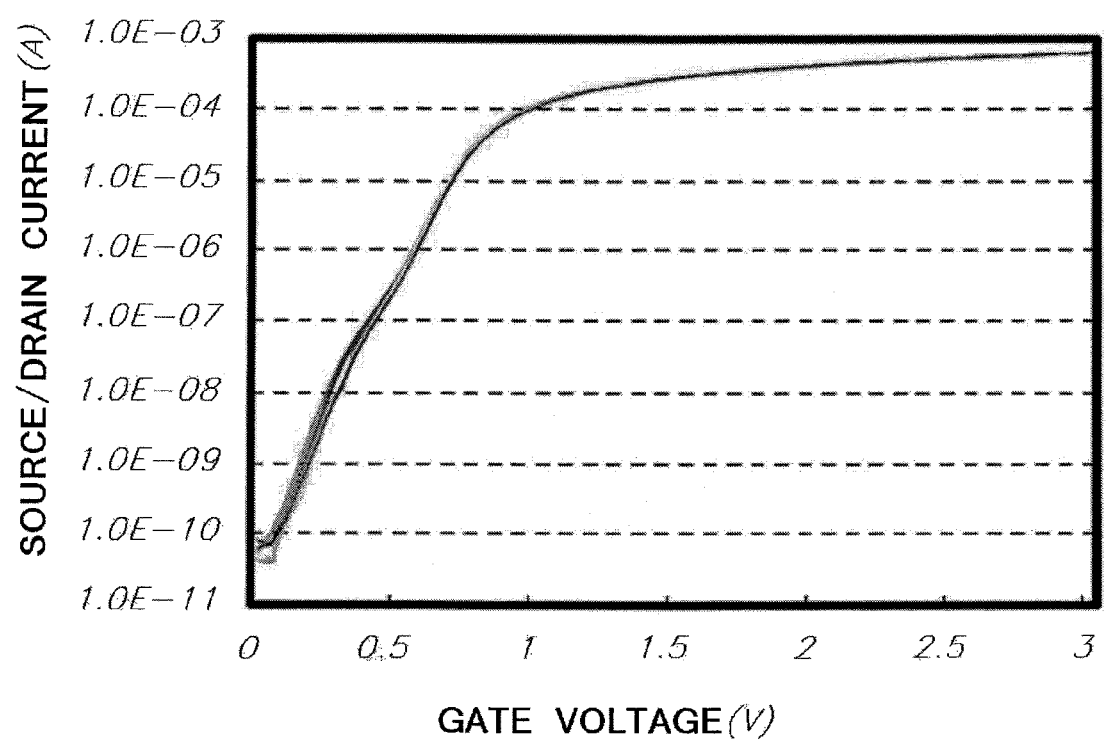
Figure 5B:
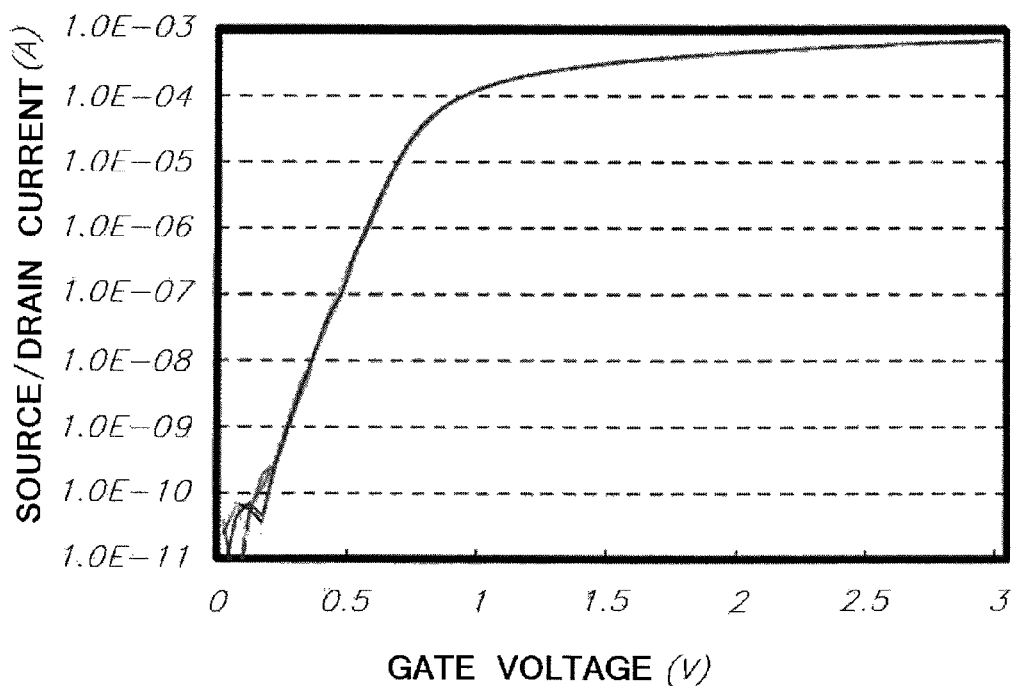
Figure 6:
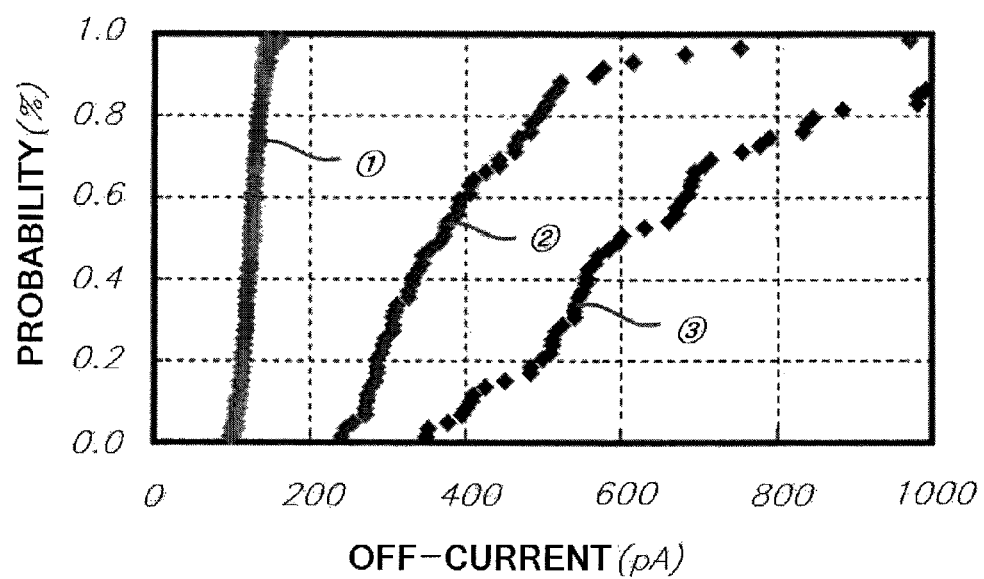

Example FIGS. 5a and 5b are graphs representing a correlation of gate voltage and source/drain current before and after hump characteristics are improved;

Example FIG. 6 is a graph representing a correlation of an off current from an off current experimental result.

DESCRIPTION

Referring to example FIG. 4, a P type well or N type well 402 for a high voltage transistor is formed over a semiconductor substrate 401. Well 402 is doped with impurities of opposite type to impurities in semiconductor substrate 401. A plurality of trenches are formed by etching both ends of the well 402 and the semiconductor substrate 401 adjacent the well 402 to a predetermined depth. After forming well 402, a deep well may be formed by performing a deep well drive through a thermal diffusion process at a temperature of 1150° C. for 350 minutes. Next, a liner oxidation process may be performed over the inner wall of the trench twice through a high-temperature thermal oxidation process.

After the high temperature liner oxidation process, an oxide film is deposited over the semiconductor substrate 401 to bury the trench. A chemical mechanical polishing (CMP)

process may be performed to planarize the oxide film, thereby forming a shallow trench isolation (STI) 403. A gate oxide film 404 and a photo resist film may be formed over the semiconductor substrate 401 including the STI 403. A photo resist film pattern 405 is formed so that impurity ions can be implanted into the side wall edge and one side area of the STI 403 formed in both ends of the well 402.

The photo resist pattern 405 may be used as a mask to implant impurity ions into the side area of the STI 403 and the edge of the side wall edge of the STI 403. That is, the impurity ions are also implanted into an active area portion spaced by 0.244 μm from the side area of the STI 403 and the side wall edge of the side area of the STI 403 so that a well-type barrier area 406 can be formed near the active area. Accordingly, high-concentration impurity ions are implanted near an active area to form the well-type barrier area 406, so that as the doping concentration of the impurity ions of the barrier area 406 becomes high, it is possible to prevent the impurity ions in the well 402 area of a high voltage device from escaping to the STI area. In accordance with embodiments, although the impurity ions in the well 402 area of the high voltage escape to the STI 403 area, the impurity ions having doping concentration of a high numerical value may be supplemented. Thus, the high concentration impurity ions doped in the barrier area 406 can serve as a kind of a low voltage well-type mask. In addition, as the impurity P-type impurity containing boron (B) or N-type impurity containing phosphorus (P) can be used.

Example FIGS. 5a and 5b are graphs representing a correlation of the gate voltage and the source/drain current before and after hump characteristics are improved. Example FIG. 5a is a graph showing hump characteristics before a barrier area 406 is formed with high concentration impurity ions in an active area. In a transistor, it is normal that when voltage is applied to the gate, a channel is formed between the source and the drain under the gate oxide film, so that the electrons may flow between source and drain. However, when a high-voltage well is formed, the concentration of the impurity ions is low so that although the voltage is not applied to the gate, current flows. That is, leakage current is generated, thereby making it possible to cause a hump phenomenon. However, a high-concentration impurity is implanted in the barrier area according to embodiments so that it is possible to implement a device having an improved hump characteristic.

The example FIG. 5B shows a graph showing improved hump characteristics. It shows that current can flow only when at least 0.1V is applied to the gate.

Example FIG. 6 is a graph representing a comparison between an off current in the related art and an off current experimental result according to embodiments. This allows a more concrete comparison of the difference between the graphs of FIGS. 5A and 5B. It illustrates the probability that an off current may be generated in a transistor. When a barrier area 406 is formed in a well by implanting high-concentration impurity ions around the circumference of the active area of the side wall edge in the STI, the off-current is about 150 pA on an average, as shown by 1 in example FIG. 6. The off-current generated in the semiconductor device manufactured according to the related art may increased to about 250 pA and 356 pA or more as shown in the graph by 2 and 3.

In embodiments, the impurity ions in the high voltage well area are kept from the STI area so that the hump characteristics generating leakage current are improved, making it possible to suppress malfunctions of the device.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a well in a semiconductor substrate by implanting a first conductive type impurity ions into the semiconductor substrate;
   forming a shallow trench isolation by etching both ends of the well and the semiconductor substrate adjacent both ends of the well;
   forming a gate oxide film on a upper surface of the semiconductor substrate including the shallow trench isolation;
   forming a photoresist pattern on the gate oxide film so that impurity ions are implanted into a side wall edge and one side area of the shallow trench isolation formed in both ends are of well; and
   forming a barrier area in the well adjacent the side wall edge and the one side area of the shallow trench isolation by implanting the first conductive type impurity ions at a relatively higher concentration than an impurity ion concentration in said well using the photoresist pattern as a mask.

2. The method of claim 1, wherein said impurity ions are implanted into one side area of the shallow trench isolation and an active area spaced by 0.244 μm from a side wall edge of the one side area of the shallow trench isolation so that a portion of the active area is a barrier area.

3. The method of claim 1, wherein said impurity ions are N type impurity ions.

4. The method of claim 1, wherein said N type impurity ions comprise phosphorous.

5. The method of claim 1, wherein said impurity ions are P type impurity ions.

6. The method of claim 5, wherein said P type impurity ions comprise Boron.

7. The method of claim 1, wherein said oxide film is planarized by a chemical mechanical polishing (CMP) process.

8. The method of claim 1, comprising forming a deep well.

9. The method of claim 1, wherein said well is formed by a thermal diffusion process at a temperature of 1150° C. for 350 minutes.

* * * * *